United States Patent [19]

Hoult

[11] Patent Number: 5,099,116
[45] Date of Patent: Mar. 24, 1992

[54] OPTICAL DEVICE FOR MEASURING DISPLACEMENT

[75] Inventor: Robert A. Hoult, Bethel, Conn.

[73] Assignee: The Perkin-Elmer Corporation, Norwalk, Conn.

[21] Appl. No.: 603,587

[22] Filed: Oct. 25, 1990

[51] Int. Cl.$^5$ .............................................. H01J 40/14
[52] U.S. Cl. ............................ 250/237 G; 250/231.14
[58] Field of Search ......... 250/237 G, 231.14, 231.16, 250/231.17; 356/375; 33/705, 707

[56] References Cited

U.S. PATENT DOCUMENTS

| 4,051,367 | 9/1977 | Sayle et al. | 250/237 G |
| 4,091,281 | 5/1978 | Willhelm et al. | 250/237 G |
| 4,195,909 | 4/1980 | Holle et al. | 250/237 G |
| 4,265,542 | 5/1981 | S | 356/356 |
| 4,377,028 | 3/1983 | Imahashi | 29/57 H |

Primary Examiner—David C. Nelms
Assistant Examiner—Que T. Le
Attorney, Agent, or Firm—H. S. Ingham; E. T. Grimes

[57] ABSTRACT

In optical device for measuring displacement an optical grating is formed of alternating transparent and opaque stripes having equal widths. The grating is in an aperture plane with the stripes parallel to a central plane that is perpendicular to the aperture plane. Respective sub-pluralities of the stripes are located in an aperture area in the aperture plane, so that incident light rays on the aperture area are at least partially passed as beams by the transparent strips in the aperture area. A concave mirror has it center of curvature at the aperture area so as to return the beams back to the aperture area. The return beams are further passed by the transparent strips in the aperture area as return light. The grating is displaceable laterally to the cental plane, such that a corresponding responsiveness of the return light intensity to the lateral position provides a measure of displacement of the grating relative to the central plane. Alternative device with reflecting strips function similarly.

18 Claims, 2 Drawing Sheets

OPTICAL DEVICE FOR MEASURING DISPLACEMENT

This invention relates to optical measurement of small linear displacements, and particularly to a device for measuring such displacements utilizing an optical grating.

BACKGROUND OF THE INVENTION

Measurement of small linear displacements without interfering with the displacement of the object being displaced generally involves the use of costly devices, precision alignments, and frequent realignments and recalibrations. Optical devices are used because they do not interfere. These include dual-laser range finders, single- or dual-laser radar systems, and interferometers. The latter devices may utilize optical gratings for detecting fringe patterns. Non-optical systems include capacitance devices which are difficult to linearize.

Optical positioning systems are utilized for precision alignment of semiconductor patterns with masking plates using laser light. For example, in U.S. Pat. No. 4,377,028 (Imahashi) reflected light from a pattern on a wafer is focused through a mask with the same pattern, and the transmitted light is detected to establish alignment. U.S. Pat. No. 4,265,542 involves using interference and diffraction effects produced by coherent light impinging upon or passing through repetitive patterns on a photomask and a semiconductor surface.

SUMMARY OF THE INVENTION

Objects of the invention are to provide a novel device for measuring small linear displacement of an object without interfering with the displacement, to provide a novel optical device for measuring linear displacement, and to provide a novel device which utilizes an optical grating in the measurement of linear displacement.

The foregoing and other objects are achieved by an optical device including an aperture means defining an optical aperture area in an aperture plane, the aperture area being substantially bisected by a central plane defined perpendicularly to the aperture plane. A light source means directs incident light rays to the aperture area. An optical grating is formed of a plurality of alternating first stripes and second stripes having equal widths, the first stripes being formed to pass incident light rays and the second stripes being formed to block incident light rays. The grating is disposed substantially in the aperture plane with the stripes parallel to the central plane and respective subpluralities of the first stripes and the second stripes located in the aperture area, so that the incident light rays are at least partially passed as beams by the first stripes in the aperture area.

An imaging means such as a concave mirror is disposed to focus at the aperture area a reversed mirror image of the grating in unity magnification so that each stripe on one side of the central plane is imaged equidistantly on the other side of the central plane. The imaging means is receptive of the beams so as to return the beams back to the aperture area. The grating is configured such that the beams may be further passed by the first stripes or the second stripes in the aperture area as return light with a return light intensity. A detector means detects the return light intensity. The grating has a selectable lateral position in the aperture plane, and the lateral position is displaceable perpendicularly to the central plane, whereby a corresponding responsiveness of the return light intensity to the lateral position provides a measures of displacement of the grating relative to the central plane.

The return light intensity has cyclic maxima and minima associated with alignment and non-alignment of stripe delineations with the central plane during displacement of the lateral position. Thus the detector means may comprise counter means for counting the maxima or minima to provide the measure of displacement.

In one aspect of the invention the alternating first and second stripes of the grating are alternating transparent stripes and opaque stripes, so that the light rays are partially passed as beams both ways through the transparent stripes. In another aspect the first stripes are reflective of the light rays in both directions, and the second stripes are effectively non-reflective. In a further aspect the first stripes are reflective of the incident light rays, and the beams returned from the imaging means are further reflected by the second stripes as return light.

In the latter case of both the first and second stripes being reflective, in a preferred embodiment, the imaging means is centered on an optical axis defined in the central plane perpendicular to the aperture plane through a point of intersection therewith, a further plane is defined through the optical axis normal to the aperture plane and the central plane, and the light source means is positioned in the further plane at an acute angle to the optical axis with respect to the point of intersection. The detector means is also positioned in the further plane at an acute angle from the central plane but oppositely from the light source means. The first reflective stripes are oriented at a reflecting angle so as to direct the beams toward the imaging means, and the second reflective stripes are oriented at the reflecting angle oppositely from the first reflective stripes so as to be receptive of return beams from the imaging means and direct the return light toward the detector means. This system is most efficient with the acute angles each being about 60°.

DETAILED DESCRIPTION OF THE DRAWINGS

DETAILED DESCRIPTION OF THE INVENTION

Figure 1A:
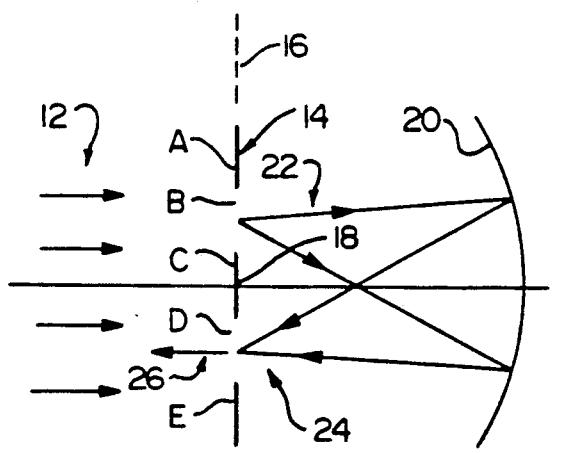
FIGS. 1a and 1b are schematic drawings showing the principle and a first embodiment of an optical system according to the invention.
Figure 1B:
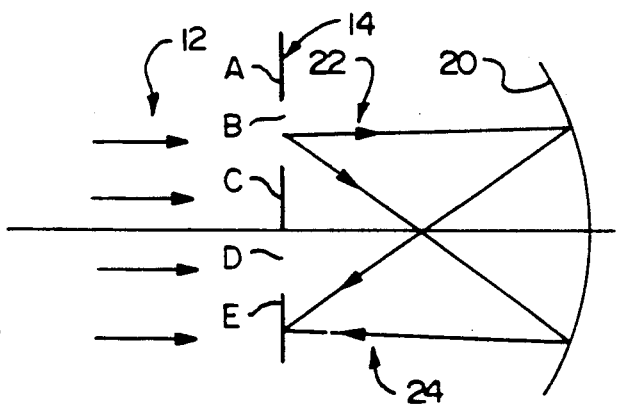

The principle of the invention is shown in FIGS. 1a and 1b. In FIG. 1a light rays 12 from a light source (not shown) are incident on an optical transmission grating 14 having alternate opaque stripes A,C,E and transparent stripes B,D, all of equal width. The stripes are parallel to a central plane 16, which is perpendicular to the drawing in FIG. 1a. The grating is placed at the center of curvature 18 of a spherical mirror 20 (or a cylindrical mirror or, for greater precision, a parabolic reflector). The mirror thus focusses back onto the grating an image of the grating in unity magnification, so that each stripe on the grating on one side of the central plane is imaged equidistantly on the other side of the central plane. For example the image of stripe B is focussed by the mirror onto stripe D and vice versa. With this arrangement half of the incident light 12 is passed as a series beams (on shown at 22) by the grating 14, and these beams are returned as reflected beams 24 by the mirror 20 back through the grating as returned light 26 toward the light source.

FIG. 1b shows the grating displaced laterally by half a slit width. The image of stripe B now falls on the opaque stripe E and, with similar imaging of the other stripes, the result is that no light is returned back through the grating toward the source. An equal displacement of the grating in the opposite direction, or any multiple of such displacement in either direction, will have the same effect. More generally the stripes are configured so that incident light rays are partially passed as a series of beams by the transparent stripes, the mirror is receptive of the beams and returns at least a portion of the beams back to the aperture area, and a further portion of the beams may be further passed by the grating as return light.

If a sizable grating is displaced laterally (perpendicularly to the central plane) over a time period, the net intensity of light returning toward the source will have cyclic minima and maxima. Ideally the intensity will have a symmetrical triangular waveform with a frequency of twice the displacement frequency of the grating. This responsiveness of the return light intensity to lateral position provides a measure of displacement of the grating relative to the central plane.

With the aid of a detector, for example including an electronic counter of cycles of maxima and/or minima, this effect may be used to measure displacement of the grating relative to the other components of the optical device including the light source, mirror and an aperture stop adjacent to the grating. Thus the grating, or alternatively the other components collectively, may be mounted on an object to be displaced, so that linear displacement of the object may readily be measured. A full cycle of detector output, providing two counts if both a maximum and minimum are counted, is yielded by only a half cycle displacement of the grating stripes; thus a displacement of the grating by one pair of transparent and opaque stripes can yield four counts.

Several effects that reduce the quality of the imaging by the concave mirror may modulate the triangular waveform to become closer to sinusoidal in practice. This may actually be beneficial in some applications in that a single frequency sinewave is simpler to process with detecting electronics. Sources of modulation include depth of focus of the mirror, image aberration off-axis of a spherical mirror, and diffraction effects for very small stripe widths and numerical aperture size. The result is a lower limit to practical grating spacing, of about twice the optical wavelength.

Figure 2:
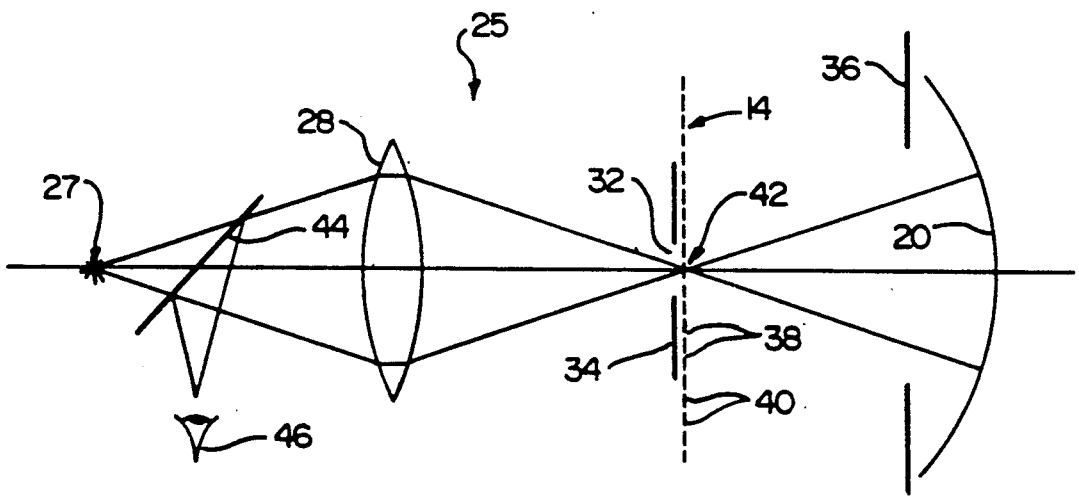
FIG. 2 is a schematic drawings of a second embodiment of an optical system according to the invention.

A simple embodiment of a device 25 having a transmission grating 14 is shown in FIG. 2. An image of a light source 27 is focussed by a collimating lens 28 on a grating 14 at an aperture area 32 defined by a stop 34 adjacent to the grating. The aperture limits the effective area of grating being illuminated. Alternatively the aperture area 32 may be defined on the grating 14 by the finite size of the light source image instead of with a physical stop. The numerical aperture of the mirror is also advantageously limited by a second stop 36. The grating with its pluralities of transparent stripes 38 and opaque stripes 40 is larger than the aperture area at least to the extent of intended displacement distances. Respective subpluralities 42 of the two types of stripes should remain within the area to provide the intended effect of maxima and minima in returned light intensity. At least two and preferably at least ten of each of the stripes should be in the area.

A beamsplitter 44 consisting of a partial reflector intercepts return light from the mirror 20 for detection of its intensity by a detector 46. This type of beamsplitter detector means results in relatively high loss of available light. A more efficient detection system may be used, such as with the source and detector off-axis to the extent additional aberration can be tolerated.

Figure 3:
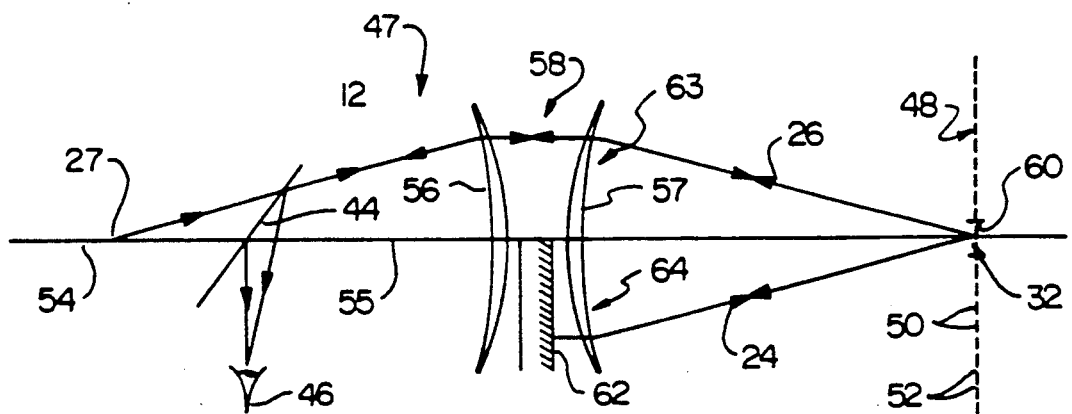
FIG. 3 is a schematic drawing of a third embodiment of an optical system according to the invention.

An embodiment of a device 47 utilizing a reflection grating 48 is illustrated in FIG. 3. The grating has reflecting stripes 50 oriented flat in the aperture plane, these stripes being spaced by second stripes 52 that are effectively non-reflective with respect to the incident light rays 12 of the device. (The non-reflective stripes may be reflective if they harmlessly reflect light away from the other optics.) A light source 27 is positioned on an optical axis 54 in a central plane 55 defined perpendicular to the plane of FIG. 3. A collimator lens 56 renders the incident light rays 12 parallel and an objective lens 57 is receptive of a portion of the parallel rays 58 and focuses these to the focal point 60 of the objective 57 at the grating 48 on the optical axis 54. In this example the size of the image of source 26 defines the aperture area 32 on the grating. As depicted, meniscus lenses are advantageous in this application.

Figure 4A:
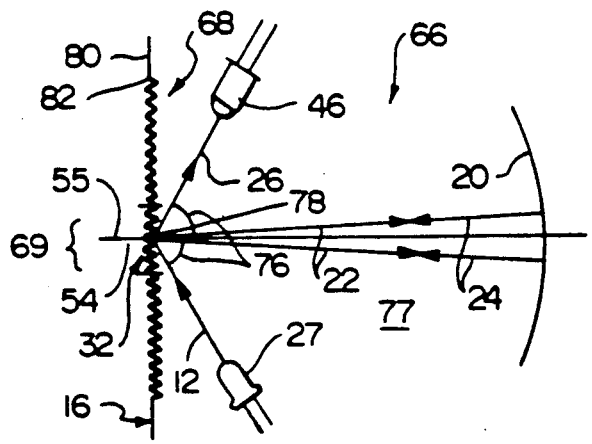
FIGS. 4a and 4b are schematic drawings of a fourth embodiment of an optical system according to the invention.
Figure 4B:
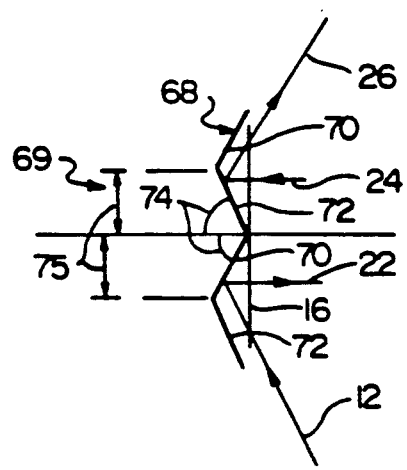

A plane mirror 62 is disposed partially between the lenses 56,57 so as to extend perpendicularly (downward in FIG. 3) from the central plane 55 on one side thereof. The incident light 12 passes through the upper half 63 of the lenses. The mirror imaging means comprises the plane mirror 62 as well as the lower half portion 64 of the objective lens 57, thus simulating a spherical mirror with conjugate foci 60 located coincidentally at the aperture area 32. Thus, according to the same principles as for a transmitting grating, grating stripes are focussed by the mirror and lens back onto the grating. Depending on lateral position of the grating, all, none or a portion of returned beams 24 will be further reflected by the reflective stripes of the grating back as return light 26 through the upper half 63 of the lenses to the intercepting reflector 44 and detector 46. FIG. 4a and 4b show a preferred embodiment of a device 66 with a reflecting grating 68. As indicated in FIG. 4b, showing a small area 69 from FIG. 4a, in this case the grating is formed of two sets of reflecting stripes 70,72 oriented at alternating angles 74. The angles are preferably equal but opposite with respect to the central plane 55, so that the first stripes 70 and second stripes 72 have equal projected widths 75 in the aperture plane 16. The light source 27 is disposed in a further plane 77 defined through the optical axis normal to both the aperture plane and the central plane. The light source is spaced from the central plane 55 at an acute angle 76 to the central plane with respect to the point of intersection 78 of the optical axis 54 and the aperture plane 16. The detector 46 for return light 26 is positioned in the further plane 77 at the same acute angle from the central plane but oppositely from the light source 27 so as to hypothetically receive light rays therefrom hypothetically reflected by the aperture plane in absence of the grating.

The acute angle 76 and the angle of orientation 74 of the stripes are selected cooperatively so that the incident light 12 is reflectively passed as beams 22 toward a concave mirror 20 which is disposed with its center of curvature 78 centered at the aperture 32. The mirror returns reflected beams 24 which may then be incident on all or part of the second stripes 72 depending on lateral position of the grating. Whatever portion of each beam that is incident on a second stripe is reflected as return light toward the detector 46. Lateral displacement of the grating will be detected as a series of maxima or minima as for the previously described embodiments.

An angle of about 60° is advantageous for both the acute angle 76 and the orientation 74 of the stripes to the central plane, as this provides for optimum efficiency with the incident light and the finally reflected light just grazing the non-used stripes. With this arrangement, although the incident light 12 is divided into beams by the first stripes 70, nearly all light incident on the grating in the aperture area 32 is reflected toward the concave mirror 20, whereas only half is passed along in the prior embodiments. Also the configuration allows for detection of all light 26 reflected to the detector without interference or loss of either the incident or returned light at a beam splitter.

It further will be appreciated that light not reflected by the second stripes will be reflected back toward the source by the first stripes 70. This is ignored in the specific embodiment of FIGS. 4a and 4b; however in an alternative aspect the detector 46 may be placed alongside the light source 27 instead of where shown in the figure. In this case any reflectivity of the second stripes plays no role.

The following is an example for implementing the embodiment of FIG. 4a. A Fairchild FLV104A light emitting diode with wavelength 665 nm is located about 1 cm from the aperture area; this has a narrow light cone of about 4.3°, well suited to provide its own aperture area. The beam is focussed about 1 cm in front of the grating, focus not being critical. Aperture area is elliptical, approximately 4 mm by 2 mm. The grating is blazed at 30° to the aperture plane (60° to the center plane) with both facets specularly reflecting. Grating pitch is 18 microns. The mirror is spherical with a radius of 50 mm, and has a diameter of about 1 cm of which about 6 mm is used. The detector with a bug-eye lens is a Motorola MFOD200 and located about 1 cm from the aperture area; exact distance is not critical. Diffraction maxima from the initial grating reflection are approximately 4.3° apart; two diffraction beams are returned by the mirror.

A further aspect, illustrated in FIG. 4a, is use of a reflective flat land 80 extending from the termination boundary 82 of the grating stripes 70,72. When the land falls under the incident light the latter is reflected directly to the detector. This effect provides an indexing position with an electronically detectable transition when the grating is moved until the stripes fall under the grating, thereby decreasing the signal substantially. In the case of a transmission grating the land may be simply an opaque edge of the grating.

The displacement measuring device of the present invention is particularly useful in applications where no physical contact with a measuring instrument is tolerable. It is only necessary that one part of the device (e.g. the grating) be mounted on the object. The device is substantially lower in cost, and less sensitive to focussing and alignment, than other optical systems such as laser ranging devices. Applications include measuring interferometer displacements in spectrophotometer.

While the invention has been described above in detail with reference to specific embodiments, various changes and modifications which fall within the spirit of the invention and scope of the appended claims will become apparent to those skilled in this art. Therefore, the invention is intended only to be limited by the appended claims or their equivalents.

What is claimed is:

1. A device for measuring displacement, comprising:
aperture means defining an optical aperture area in an aperture plane, the aperture area being intersected by a central plane defined perpendicularly to the aperture plane;
light source means for directing incident light rays to the aperture area;
an optical grating formed of a plurality of alternating first stripes and second stripes having equal widths, the first stripes being configured to pass incident light rays and the second stripes being configured to block incident light rays, the grating being disposed substantially in the aperture plane with the stripes parallel to the central plane and respective subpluralities of the first stripes and the second stripes located in the aperture area, so that the incident light rays are at least partially passed as beams by the first stripes in the aperture area;
imaging means disposed to focus at the aperture area an image of the grating in unity magnification, the imaging means being receptive of the beams so as to return the beams back to the aperture area, the grating being configured such that the beams may be further passed by the first stripes or the second stripes in the aperture area as return light with a return light intensity; and
detector means for detecting the return light intensity;
the grating having a selectable lateral position in the aperture plane, the lateral position being displaceable perpendicularly to the central plane, whereby a corresponding responsiveness of the return light intensity to the lateral position provides a measure of displacement of the grating relative to the central plane.

2. The device according to claim 1 wherein the aperture area is substantially bisected by the central plane, and the image is a reversed mirror image of the grating in unity magnification so that each stripe on one side of the central plane is imaged equidistantly on the other side of the central plane.

3. The device according to claim 1 wherein the return light intensity has cyclic maxima and minima associated with alignment and non-alignment of stripe delineations with the central plane during displacement of the lateral position, and the detector means comprises counter means for counting the maxima or minima to provide the measure of displacement.

4. The device according to claim 1 wherein the stripes terminate at a boundary on the grating so as to provide an indexing position for the grating detectable by the detector means.

5. A device for measuring displacement, comprising:
aperture means defining an optical aperture area in an aperture plane, the aperture area being substantially bisected by a central plane defined perpendicularly to the aperture plane;

light source means for directing incident light rays to the aperture area;

an optical grating formed of a plurality of alternating transparent stripes and opaque stripes having equal widths, the grating being disposed in the aperture plane with the stripes parallel to the central plane and respective subpluralities of the transparent stripes and the opaque stripes located in the aperture area, such that the incident light rays are partially passed as beams through the transparent stripes in the aperture area;

imaging means disposed to focus at the aperture area a reversed mirror image of the grating in unity magnification so that each stripe on one side of the central plane is imaged equidistantly on the other side of the central plane, the imaging means being receptive of the beams so as to return the beams back to the aperture area such that the beams may be further passed through the transparent stripes in the aperture area as return light with a return light intensity; and detector means for detecting the return light intensity;

the grating having a selectable lateral position in the aperture plane, with the lateral position being displaceable perpendicularly to the central plane, whereby a corresponding responsiveness of the return light intensity to the lateral position provides a measure of displacement of the grating relative to the central plane.

6. The device according to claim 5 wherein the aperture means comprises a light stop with an aperture wherein defining the aperture area, the light stop being positioned adjacent to the grating.

7. The device according to claim 5 wherein the light source means comprises a light source and a collimating lens disposed to focus an image of the light source on the grating at the aperture area.

8. The device according to claim 7 wherein the aperture means comprises the image of the light source having a finite size defining the aperture area.

9. The device according to claim 5 wherein the imaging means comprises a spherical mirror having center of curvature centered in the aperture area.

10. The device according to claim 5 wherein the detector means includes a reflector disposed to intercept return light.

11. A device for measuring displacement, comprising:
aperture means defining an optical aperture area in an aperture plane, the aperture area being substantially bisected by a central plane defined perpendicularly to the aperture plane;

light source means for directing incident light rays to the aperture area;

an optical grating formed of a plurality of alternating first stripes and second stripes having equal widths, the first stripes being reflective of incident light rays and the second stripes being effectively non-reflective of incident light rays, the grating being disposed in the aperture plane with the stripes parallel to the central plane and respective subpluralities of the first stripes and the second stripes located in the aperture area, such that the incident light rays are at least partially reflected as beams by the first stripes in the aperture area;

imaging means disposed to focus at the aperture area a reversed mirror image of the grating in unity magnification so that each stripe on one side of the central plane is imaged equidistantly on the other side of the central plane, the imaging means being receptive of the beams so as to return the beams back to the aperture area such that the beams may be further reflected by the first stripes in the aperture area as return light with a return light intensity; and detector means for detecting the return light intensity;

the grating having a selectable lateral position in the aperture plane, with the lateral position being displaceable perpendicularly to the central plane, whereby a corresponding responsiveness of the return light intensity to the lateral position provides a measure of displacement of the grating relative to the central plane.

12. The device according to claim 11 wherein the reflective stripes are oriented flat in the aperture plane, an optical axis is defined in the central plane perpendicular to the aperture plane, the light source means comprises a light source on the optical axis and a lens means disposed to focus an image of the light source on the grating at the aperture area, and the imaging means is disposed to extend from the central plane on one side thereof between the light source and the grating, and has conjugate foci coincidingly located at the aperture area.

13. The device according to claim 12 wherein the lens means comprises a collimating lens receptive of light rays from the light source to render the light rays parallel and an objective lens receptive of the parallel rays and having a focal point located at the grating, the imaging means comprises a plane mirror disposed partially between the lenses so as extend perpendicularly from the central plane on one side thereof, and the imaging means further comprises a portion of the objective lens between the mirror and the grating.

14. A device for measuring displacement, comprising:
aperture means defining an optical aperture area in an aperture plane, the aperture area being intersected by a central plane defined perpendicularly to the aperture plane;

light source means for directing incident light rays to the aperture area;

an optical grating formed of a plurality of alternating first reflective stripes and second reflective stripes having substantially equal projected widths in the aperture plane, the first reflective stripes being reflective of the incident light rays and the second reflective stripes being non-reflective of the incident light rays, the grating being disposed substantially in the aperture plane with the stripes parallel to the central plane and respective subpluralities of the first reflective stripes and the second reflective stripes located substantially in the aperture area such that the incident light rays are at least partially reflected as beams by the first reflective stripes in the aperture area;

imaging means disposed to focus at the aperture area an image of the grating in unity magnification, the imaging means being receptive of the beams so as to return the beams back to the aperture area, the grating being configured such that the beams may be further reflected by the second reflective stripes in the aperture area as return light with a return light intensity; and detector means for detecting the return light intensity;

the grating having a selectable lateral position in the aperture plane, with the lateral position being displaceable perpendicularly to the central plane, whereby a corresponding responsiveness of the return light intensity to the lateral position provides a measure of displacement of the grating relative to the central plane.

15. The device according to claim 14 wherein the aperture area is substantially bisected by the central plane, and the image is a reversed mirror image of the grating in unity magnification so that each stripe on one side of the central plane is imaged equidistantly on the other side of the central plane.

16. The device according to claim 15 wherein the imaging means is centered on an optical axis defined in the central plane perpendicular to the aperture plane through a point of intersection therewith, a further plane is defined through the optical axis normal to the aperture plane and the central plane, the light source means is positioned in the further plane at an acute angle to the optical axis with respect to the point of intersection, the detector means is positioned in the further plane at an acute angle from the central plane oppositely from the light source means, the first reflective stripes are oriented at a reflecting angle so as to direct the beams toward the imaging means, and the second reflective stripes are oriented at a reflecting angle oppositely from the first reflective stripes so as to be receptive of return beams from the imaging means and direct the return light toward the detector means.

17. The device according to claim 16 wherein the imaging means comprises a spherical mirror having a center of curvature centered in the aperture area.

18. The device according to clam 16 wherein each acute angle is about 60°.

* * * * *